US007661082B1

(12) United States Patent (10) Patent No.: US 7,661,082 B1
McMillan et al. (45) Date of Patent: Feb. 9, 2010

(54) SYSTEM AND METHOD FOR ABSTRACTION REFINEMENT VERIFICATION

(75) Inventors: Kenneth L. McMillan, Berkeley, CA (US); Nina Amla, Hoboken, NJ (US)

(73) Assignee: Cadence Design Systems, Inc., San Jose, CA (US)

( * ) Notice: Subject to any disclaimer, the term of this patent is extended or adjusted under 35 U.S.C. 154(b) by 115 days.

(21) Appl. No.: 11/692,802

(22) Filed: Mar. 28, 2007

(51) Int. Cl.
*G06F 17/50* (2006.01)
*G06F 9/45* (2006.01)

(52) U.S. Cl. .................. 716/5; 716/1; 716/2; 716/3; 716/4; 716/18; 703/13; 703/14

(58) Field of Classification Search ............... 716/1–5, 716/18; 703/13, 14
See application file for complete search history.

(56) References Cited

U.S. PATENT DOCUMENTS

| 6,587,998 | B2 * | 7/2003 | Rodeh ........................... 716/5 |
| 7,203,631 | B2 * | 4/2007 | Fraer et al. .................... 703/14 |
| 7,305,637 | B2 * | 12/2007 | Ganai et al. ................... 716/4 |
| 2003/0225552 | A1 | 12/2003 | Ganai et al. |
| 2004/0123254 | A1 * | 6/2004 | Geist et al. .................... 716/4 |

OTHER PUBLICATIONS

Amla et al, "An Analysis of SAT-Based Model Checking Techniquese in an Industrial Environment", Correct Hardware Design and Verification Methods, Lecture Notes in Computer Science No. 3725, 2005.
Amla et al, "A hybrid of counterexample-based and proof-based abstraction", Formal Methods in Computer-Aided Design, Lecture Notes in Computer Science, vol. 3312, 2004.
Awedh et al, "Increasing the Robustness of Bounded Model Checking by Computing Lower Bounds on the Reachable States", University of Colorado at Boulder, available at vlsi.colorado.edu/~awedh/myPapers/bddsat.pdf.
Biere et al, "Liveness Checking as Safety Checking", Electronic Notes in Theoretical Computer Science, 66, No. 2, 2002—available at http://www.elseiver.nl/locate/entcs/volume66.html.
Biere et al, "Symbolic Model Checking without BDDS*", TACAS'99 and ETAPS'99, Amsterdam, The Netherlands, Lecutre Notes in Computer Science, vol. 1579, 1999.

(Continued)

*Primary Examiner*—Jack Chiang
*Assistant Examiner*—Nghia M Doan
(74) *Attorney, Agent, or Firm*—Townsend and Townsend and Crew LLP

(57) ABSTRACT

An apparatus and methods for the verification of digital design descriptions are provided. In an exemplary embodiment, a method of verifying a property in a digital design description is provided. The method includes deriving an abstraction of the digital design description, determining a counterexample by an approximate reachable state computation, justifying the counterexample, determining a justification frontier, updating the abstraction from the justification frontier, and producing a verification result for the digital design description. One feature of this embodiment is that it provides for efficient digital circuit verification. This Abstract is provided for the sole purpose of complying with the Abstract requirement rules that allow a reader to quickly ascertain the subject matter of the disclosure contained herein. This Abstract is submitted with the explicit understanding that it will not be used to interpret or to limit the scope or the meaning of the claims.

27 Claims, 4 Drawing Sheets

OTHER PUBLICATIONS

Burch et al, "Symbolic Model Checking 1020 States and Beyond", Information and Computation, vol. 98, No. 2 Jun. 1992.

Clarke et al., "Design and Synthesis of Synchronization Skeletons Using Branching Time Temporal Logic", E.A. Logics of Programs 1981, Springer Lecture Notes in Computer Science, No. 131, Springer-Verlag, 1982.

Goldberg et al, "BerkMin: a Fast and Robust Sat-Solver", Design, Automation, and Test in Europe, Mar. 2002.

Gupta et al, "Abstraction Refinement for Bounded Model Checking", Computer Aided Verification, Leture Notice in Computer Science, vol. 3576, 2005.

Huang et al, "Assertion Checking by Combined Word-level ATPG and Modular Arithmetic Constraint-Solving Techniques", Design Automation Conference, Issue 37, 2000.

Awedh et al, "Increasing the Robustness of Bounded Model Checking by Computing Lower Bounds on the Reachable States", University of Colorado at Boulder, available at vlsi.colorado.edu/~awedh/myPapers/bddsat.pdf, Nov. 2004, pp. 1-15.

Iyer et al, "Satori—A Fast Sequential SAT Engine for Circuits", ICCAD '03, Nov. 11-13, 2003.

Li et al, "Efficient Abstraction Refinement in Interpolation-Based Unbounded Model Checking", TACAS, Lecture Notes in Computer Science, vol. 3920, 2006.

Li et al, "Abstraction Refinement in Symbolic Model Checking Using Satisfiability as the Only Decision Procedure", STTT, vol. 7, No. 2, 2005.

Marques-Silva, J., "Improvements to the Implementation of Interpolant-Based Model Checking", CHARME, 2005, LNCS 3725, 2005.

Marques-Silva et al, "GRASP: A Search Algorithm for Propositional Satisfiability", IEEE Transactions on Computers, vol. 48, No. 5, May 1999.

McMillan, K.L., "Interpolation and SAT-Based Model Checking", Lecture Notes in Computer Science, vol. 2725, 2003.

McMillan et al, "Automatic Abstraction without Counterexamples", Lecture Notes in Compter Science, vol. 2619, 2003.

Moskewicz et al, "Chaff: Engineering an Efficient SAT Solver", Proceedings of the 38th conference on Design automation, 2001.

Prasad et al, "A Survey of Recent Advances in SAT-Based Formal Verification", STTT, vol. 7, No. 2, 2005.

Ravi et al, "Minimal Satisfying Assignments for Bounded Model Checking", Lecture Notes in Compter Science, vol. 2988, 2004.

Whittemore et al, "SATIRE: A New Incremental Satifiability Engine", Proc. of the Design Automation Conference, 2001.

* cited by examiner

SYSTEM AND METHOD FOR ABSTRACTION REFINEMENT VERIFICATION

FIELD OF THE INVENTION

The present invention generally relates to the field of verification of logic designs. More particularly, the invention concerns methods and apparatus for formal verification of digital circuit designs.

BACKGROUND OF THE INVENTION

Integrated circuits (ICs) have become the backbone of modern consumer electronics. The increased demand for functionality of consumer electronics has forced the complexity of IC's to skyrocket. In a number of applications, ICs must be highly functional, low cost and have low power consumption. These demands create increased complexity on the design, verification, and manufacture of ICs. These increases in complexity have significantly exacerbated the difficulties associated with verification of the designs.

There are a number of computer aided techniques that are typically used to verify the functionality of digital designs. For example, model checking is a widely used formal verification technique that may be implemented with Binary Decision Diagrams (BDD). As is known in the art, BDDs are data structures used to represent Boolean functions. With recent advances in tools to solve the Boolean satisfiability problem (SAT), SAT solvers are proving to be an effective alternative to BDD's. A given Boolean formula is considered satisfiable if all the variables in the formula can take on such values to make the formula evaluate to true. Alternatively, and potentially more important, if no combination of values can be found that forces the function to evaluate to true, then the formula is unsatisfiable. With complex digital designs, verification approaches can be significantly complex and the memory limits of a computer can be quickly reached.

In Bounded Model Checking (BMC) a system is typically unfolded "k" times and encoded as a SAT problem to be solved by a SAT solver. SAT solvers typically require the function to be expressed in Conjunctive Normal Form (CNF) which is a conjunction of clauses, where a clause is a disjunction of literals. A literal is either a variable name or its negation. A satisfying assignment returned by the SAT solver corresponds to a counterexample of length k. If the problem is unsatisfiable at length k, the SAT returns a proof that there are no counterexamples of length k. BMC, while successful in finding errors is incomplete in the sense that there is no efficient way to decide that a property is true.

Additionally, there are a number of Unbounded Model Checking (UMC) techniques that make use of the SAT-based BMC in some way. Of particular interest are the "proof-based abstraction" and the "interpolation-based" techniques. The proof-based abstraction algorithm is an iterative abstraction refinement method that typically uses a traditional BDD-based model checker to prove properties of the abstract models. In this approach an initial BMC run is accomplished, if the problem proved unsatisfiable, the resulting proof is used to guide the formulation of a new abstraction. The refinement technique typically removes parts of the design under verification such that if the property is true in the abstraction that implies that it is true in the actual design. Abstraction refinement is an iterative method that tries to prove the property on an abstraction and if a property is found to be false, a concretization step is done to determine if the failure is real, otherwise the abstraction is refined and the procedure is continued. The concretization step involves reasoning about the actual design and is most often done by employing BMC at the depth of the counterexample. As designs get larger and the counterexample depths increases, this approach can lead to significant difficulties in terms of time required to verify a design and memory constraints of the computer running the verification.

The interpolation-based model checking algorithm is a purely Boolean satisfiability (SAT) based model checking method that does not rely on abstraction refinement, though like abstraction methods, it tends to work well on properties that are localizable, and is fairly insensitive to the addition of irrelevant logic. This method uses BMC to find failures and proves properties by doing a SAT-based approximate reachability analysis. While proof-based methods do better on problems where BDDs are particularly effective, interpolation methods have advantages with larger problems. Interpolation based algorithms are fairly insensitive to irrelevant logic but once again are time and resource intensive.

Further, hybrid verification techniques exist that attempt to combine various BDD and SAT-based techniques. In one such technique conflict clauses that were learned from BDDs are used to improve the performance of SAT BMC. Another method uses BDDs to compute an over-approximation of the reachable states and applies these constraints to the SAT BMC problem. A further technique uses BDD-based reachability analysis to compute lower bounds on reachable states to accelerate SAT-based induction. Proof-based and counterexample-based abstraction methods have been combined in different phases of an iterative abstraction refinement process. One hybrid method uses a single abstraction phase that is intermediate between the proof-based and counterexample-based abstraction refinement. Abstraction refinement has also been used with BMC to find failures more effectively. A recent technique combines abstraction refinement and interpolation in a manner which is similar to using interpolation as the UMC in a proof-based technique. Most of these hybrid methods also require a significant amount of time and memory for verification. These issues pose significant limitations on the size of designs that can be verified.

Therefore there exists a need for more robust verification algorithms that can take advantage of these and other techniques to improve analysis time and fit within memory constraints.

SUMMARY OF THE INVENTION

The present invention provides a system, apparatus and methods for overcoming some of the difficulties presented above. In an exemplary embodiment, a method is disclosed that derives an abstraction of a digital design description, determines a counterexample by an approximate reachable state computation, justifies the counterexample, determines a justification frontier which is used to update the abstraction, and produces a verification of the digital design description. One feature of this embodiment is that it provides a verification of a digital design description, where other methods may fail due to memory constraints of a computing device.

In a further embodiment, a computing apparatus is provided. The computing apparatus is configured to provide a verification of a digital design description. The configuration includes deriving an abstraction of the digital design description, determining a counterexample by an approximate reachable state computation, justifying the counterexample, determining a justification frontier, updating the abstraction from the justification frontier; and producing a verification of the digital design description. One feature of this embodiment is that it allows for software assisted verification of digital design descriptions. Employing an apparatus such as the one provided herein allows significantly larger and more complex design descriptions to be verified.

In a still further embodiment, a computer software product is provided. In this embodiment the computer software product includes a media that is encoded with a set of computer instructions that cause the computer to perform verification of a digital design description. As in the above embodiments, the verification may include the derivation of an abstraction of the digital design description, a determination of a counterexample by an approximate reachable state computation, a justification of the counter example, the determination of a justification frontier, the update of the abstraction from the justification frontier and the production of a verification of the digital design description. One feature of this embodiment is that it provides a method for configuring a computer for software assisted digital design verification.

These and other features and advantages of the present invention will be appreciated from review of the following detailed description of the invention, along with the accompanying figures in which like reference numerals refer to like parts throughout.

BRIEF DESCRIPTION OF THE DRAWINGS

Various embodiments of the present invention taught herein are illustrated by way of example, and not by way of limitation, in the figures of the accompanying drawings, in which.

Figure 1A:
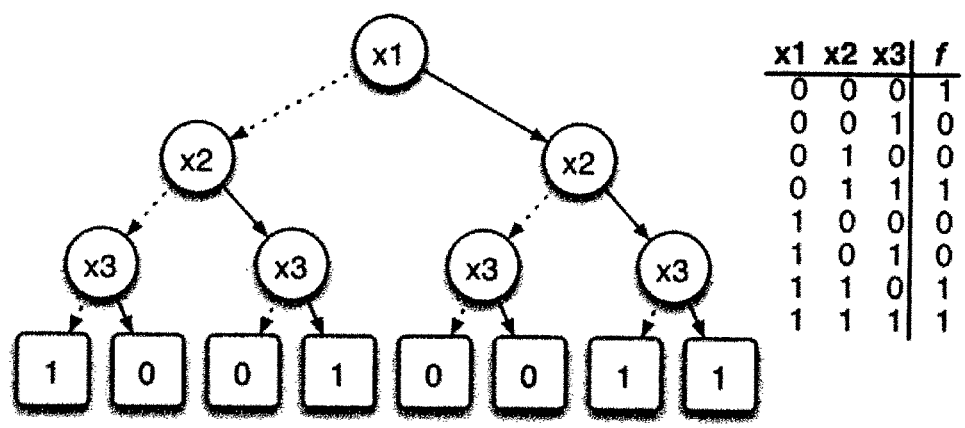
FIG. 1(a) illustrates the formulation of a binary decision diagram.

It will be recognized that some or all of the Figures are schematic representations for purposes of illustration and do not necessarily depict the actual relative sizes or locations of the elements shown. The Figures are provided for the purpose of illustrating one or more embodiments of the invention with the explicit understanding that they will not be used to limit the scope or the meaning of the claims.

DETAILED DESCRIPTION OF THE INVENTION

In the following paragraphs, the present invention will be described in detail by way of example with reference to the attached drawings. While this invention is capable of embodiment in many different forms, there is shown in the drawings and will herein be described in detail specific embodiments, with the understanding that the present disclosure is to be considered as an example of the principles of the invention and not intended to limit the invention to the specific embodiments shown and described. That is, throughout this description, the embodiments and examples shown should be considered as exemplars, rather than as limitations on the present invention. Descriptions of well known components, methods and/or processing techniques are omitted so as to not unnecessarily obscure the invention. As used herein, the "present invention" refers to any one of the embodiments of the invention described herein, and any equivalents. Furthermore, reference to various feature(s) of the "present invention" throughout this document does not mean that all claimed embodiments or methods must include the referenced feature(s).

Model checking is the process of deciding whether a given model satisfies a given formula. Model checking is most often applied to digital designs. The area of application of model checking in digital circuit designs falls within the field of verification of the design. Verification can constitute a significant portion of time and resources dedicated to the design of digital circuits. Since the complexity of digital circuits continues to increase significantly, the task of verification can become a critical bottleneck in the design cycle. There are a number of approaches to model checking, most implemented in software tools. Verification can take on the form of a solution to the Boolean satisfiability problem.

As is known in the art the Boolean satisfiability problem (SAT) is a problem that seeks to determine if the variables of a given Boolean formula can be assigned in a way as to make the formula evaluate to 1 or "true". If the set of inputs can be so assigned the formula is "satisfiable". On the other hand if no such assignment exists this implies that the formula is identically equal to 0 or "false" for all possible inputs. In this case the formula is considered "unsatisfiable. Most SAT solvers require the formula under verification to be expressed in conjunctive normal form (CNF) as a conjunction of clauses which is a disjunction of variables or their negations. For example, the CNF formula (a OR b) AND (NOT b OR c) is satisfiable if a=0, b=1 and c=1.

Figure 1B:
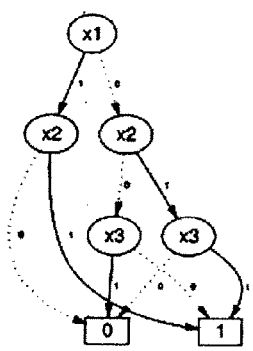
FIG. 1(b) illustrates a binary decision diagram.

Binary Decision Diagram (BDD) based model checking is one approach to verification of digital circuits. In BDD based approaches, a boolean function is represented by a graph consisting of decision nodes and edges. As illustrated in FIGS. 1(a) and 1(b), each non-terminal node in the diagram has two child nodes, typically referred to as a low child and a high child node. The edge between the parent node and the low child node represents the assignment of 0. In like manner, the edge between the parent node and the high child node represents the assignment of 1. Referring to the illustration in FIGS. 1(a) and (b), a logic function f(x1, x2, x3) may be represented by the truth table or the binary decision tree in FIG. 1(a). Lines of the truth table are represented by paths in decision tree from the parent node x1 to the terminal nodes illustrated with 1's and 0's. The first row of the truth table illustrates that the assignment x1=0, x2=0, x3=0 produces the result f=1. This assignment represents the fully dotted line path from parent node x1 through low child node x2 and low child node x3 to the terminal node containing a 1. This Binary decision tree can be redrawn as the BDD illustrated in FIG. 1(b).

Unbounded model checking methods based on Boolean satisfiability solvers are proving to be a viable alternative to BDD-based model checking. These methods include, for example, interpolation based and sequential Automatic Test Pattern Generation (ATPG) based approaches. When using interpolation based model checking, measures must be taken to prevent the overhead of abstraction refinement from dominating runtime.

Some forms of interpolation based model checking use interpolants to derive an over approximation of the reachable states with respect to a given property. In one such approach the Bounded Model Checking (BMC) problem BMC(M, p, k) is solved for an initial depth k and property p. If the problem is satisfiable, a counterexample is returned, and the algorithm terminates. If BMC(M, p, k) is unsatisfiable, the formula representing the problem is partitioned into Pref(M, p, k) ∧ Suff(M, p, k), where Pref (M, p, k) is the conjunction of the initial condition and the first transition, and Suff(M, p, k) is the conjunction of the rest of the transitions and the final condition. The interpolant Z of Pref(M, p, k) and Suff(M, p, k) is computed. Since Pref (M, p, k)=>Z, it follows that Z is true in all states reachable from I(so) in one step. This means that Z is an over-approximation of the set of states reachable from I(s0) in one step. Also, since Suff (M, p, k) is unsatisfiable, it also follows that no state satisfying Z can reach an error in k−1 steps. If Z contains no new states, that is, Z=>I(so), then a fixed point of the reachable set of states has been reached, thus the property holds. If Z has new states then R' represents an over-approximation of the states reached so far. The algorithm then uses R' to replace the initial set I, and iterates the process of solving the BMC problem at depth k and generating the interpolant as the over-approximation of the set of states reachable in the next step. The property is determined to be true when the BMC problem with R' as the initial condition is unsatisfiable, and its interpolant leads to a fixed point of reachable states. However, if the BMC problem is satisfiable, the counterexample may be spurious since R' is an over-approximation of the reachable set of states. In this case, the value of k is increased, and the procedure is continued.

Abstraction is a technique that systematically removes parts of the design under verification such that if the property is true in the abstraction that implies that it is true in the actual design. Abstraction refinement is an iterative method that tries to prove the property on an abstraction and if a property is found to be false, a concretization step is done to determine if the failure is real, otherwise the abstraction is refined and the procedure is continued.

Figure 2:
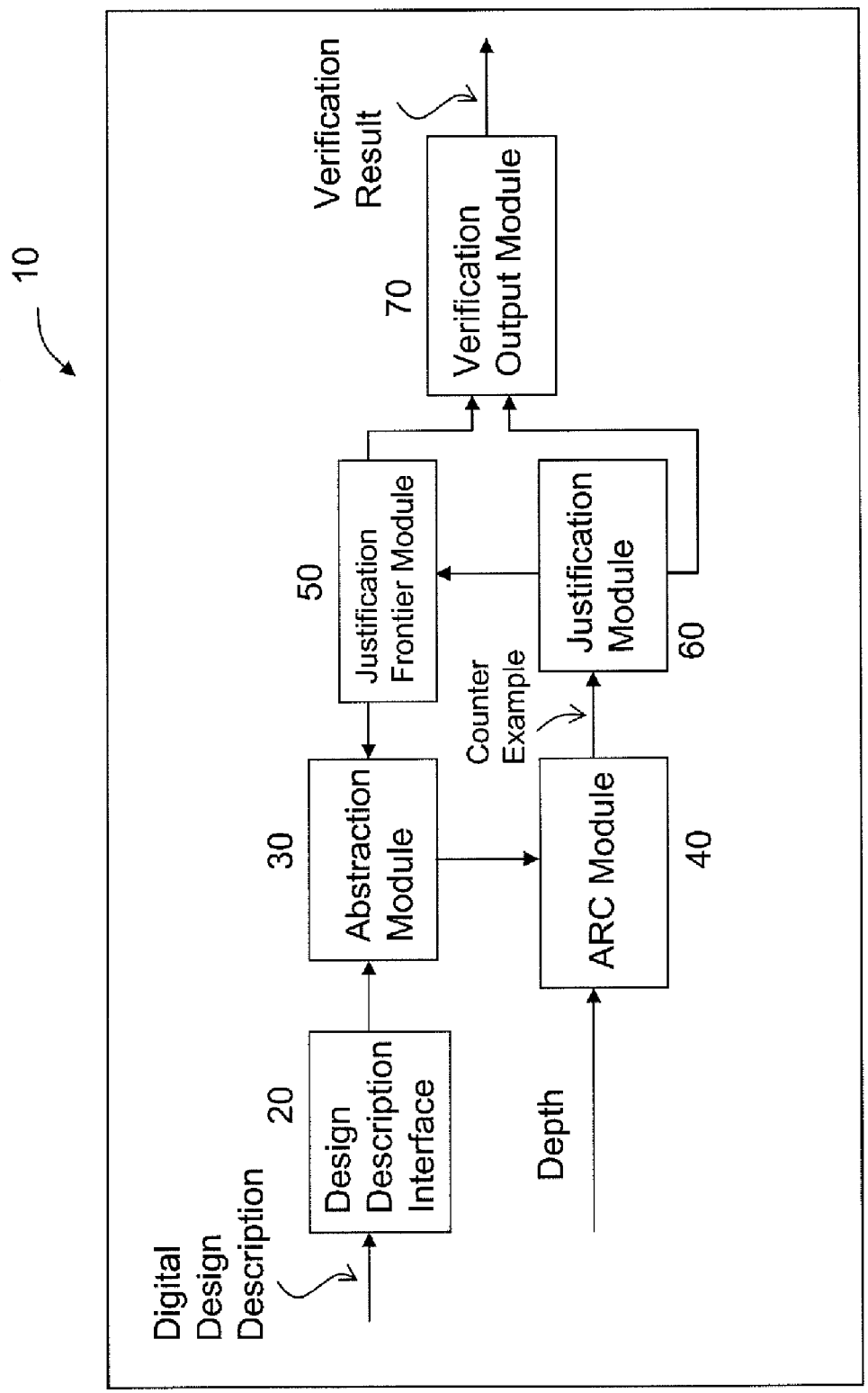
FIG. 2 is a block diagram illustrating a design verifier consistent with one embodiment provided.

One embodiment of a design verifier is illustrated in FIG. 2. In this embodiment, the design verifier 10 is implemented in computer readable instructions that control a computer in a manner to perform verification of a digital design. The design is typically represented as a description in a hardware description language. Design verifier 10 comprises a number of functional modules that perform various operations. The functional modules may be additionally implemented in computer readable instructions.

In one embodiment, design verifier 10 includes a design description interface 20. Design description interface 20 is configured to receive a digital design description. As discussed above the design description may be restricted to a particular form, such as CNF. Design description interface 20 is coupled to abstraction module 30. Abstraction module 30 derives an abstraction from the design description. An abstraction may contain a subset of the design description and may include initial states of the subset and potentially Boolean assignments of some of the variables in the abstraction. In an exemplary embodiment the initial abstraction may be empty. Abstraction module 30 is coupled to Approximate Reachable states Computation (ARC) module 40. ARC module 40 may also have an input for a desired search depth and property (not shown).

In one embodiment ARC module 40 may compute the reachable states by partitioning the given abstraction into a prefix and suffix functions. As described above, the prefix function may represent the initial states of the abstraction and the suffix the remaining states. In this module, the combined function is tested for satisfiability and if an error is found, the module may terminate and return the error to verification output module 70. If no error is found, an interpolant is computed (as described above), the set of reachable states updated from the interpolant and the process repeated until a counterexample is returned. Upon determining a counterexample, ARC module 40 forwards the counterexample to justification module 60. Since the counterexample is based on the abstraction, it is typically not a sufficient solution.

Justification module 60 is configured to produce a minimum justification of the abstract counterexample. The justification module 60 attempts to determine the validity or error of the counterexample by assigning Boolean values to a subset of the free variables (primary inputs and hidden state variables). A justification is a partial assignment sufficient to imply the property tested is false in the abstraction. The set of hidden state variables may be known as the justification frontier. Justification module 60 is coupled to justification frontier module 50.

Justification frontier module 50 refines the abstraction by adding some subset of the justification frontier to the abstraction. This updated abstraction is sent back to the abstraction module 30 for further processing. If during any process the justification frontier is empty, then the counterexample being evaluated is concrete since there are no further hidden states. In this case the counterexample fully justifies the falsehood property in the entire design description. Design verifier 10 may then output a verification result through verification output module 70.

One feature of this embodiment is that it provides an iterative abstraction refinement procedure that begins with an initial abstraction and interpolation-based model checking to determine if the abstraction satisfies a property at a given depth. On obtaining an abstract counterexample, it attempts to produce a minimal justification of the abstract counterexample by assigning Boolean values to a subset of the free variables. A justification is a partial assignment that is sufficient to imply that the property is false in the abstraction. The set of hidden state variables that are assigned in this justification at any time frame is called the justification frontier. However, if at some point the justification frontier contains no hidden variables, the abstract counterexample is a concrete counterexample, since the abstract counterexample fully justifies the falsehood of the property in the whole design. Refinement may consist of choosing some subset of the justification frontier and adding these state variables to the abstraction.

Figure 3:
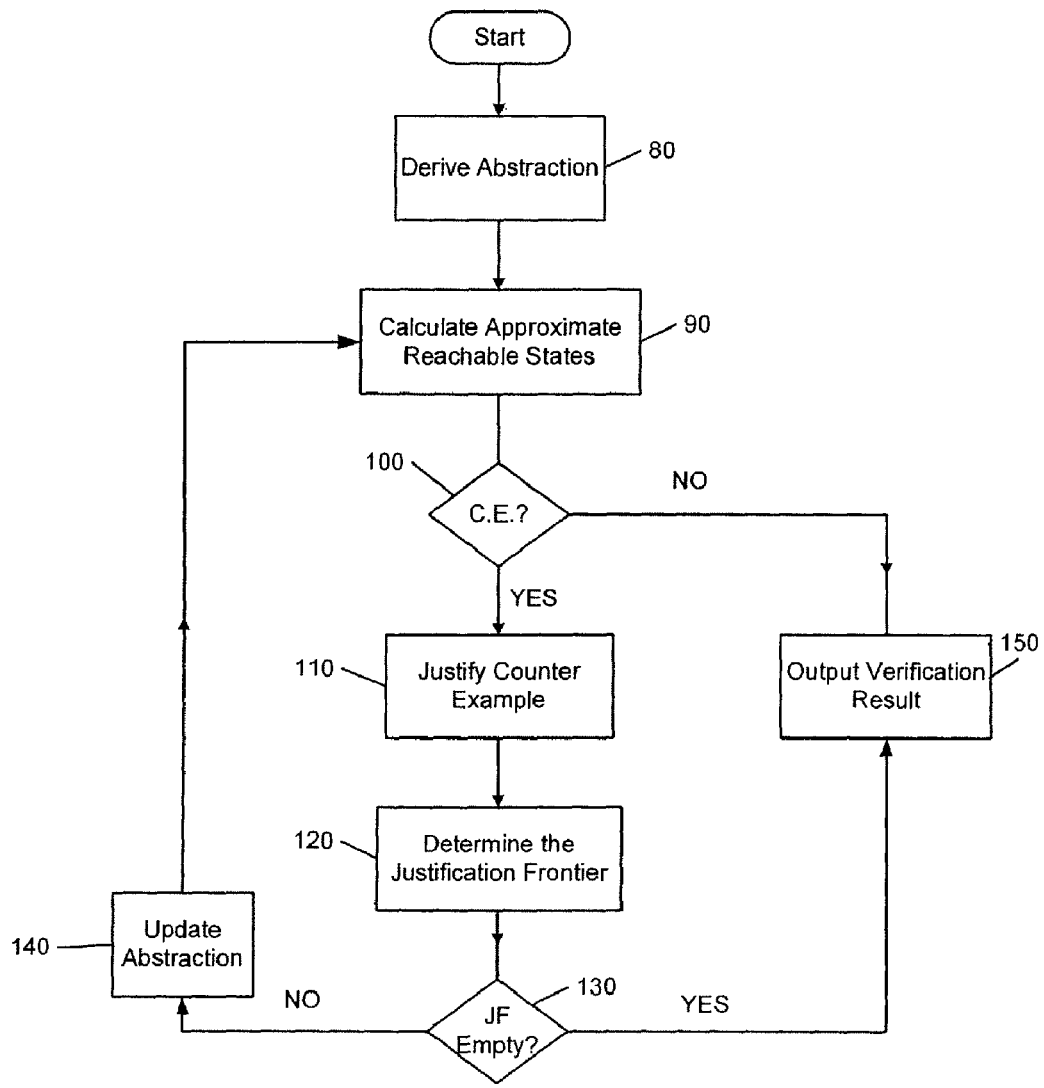
FIG. 3 illustrates an operational flow of digital design description verification.

An exemplary embodiment of an operational flow of a design verifier 10 is illustrated in FIG. 3. In this embodiment design verifier 10 begins operation in block 80 by deriving an abstraction of a digital design description. Like stated above, the digital design description may comprise computer readable instructions in a hardware description language. Initially, the abstraction may be an empty abstraction. In block 90 the ARC is calculated. In block 100, if the ARC produces no counterexample, the flow continues to block 150 where a verification output is produced. In this case an error has been found. Returning to conditional block 100, if the ARC produces a counterexample on the abstraction, the flow continues to block 110.

In block 110 design verifier 10 produces a minimal justification of the abstract counterexample by assigning Boolean values to a subset of the free variables. As described above, the justification frontier is the set of hidden state variables. In block 120, design verifier 10 determines the justification frontier. In conditional block 130 design verifier 10 decides if the justification frontier is empty, and if so the verification is complete, the counterexample is a concrete counterexample, and design verifier 10 goes to block 150 where it outputs a verification result. Returning to conditional block 130, if the justification frontier is not empty, the counterexample is not a concrete counterexample and design verifier 10 proceeds to block 140 where it updates the abstraction based on some subset of the justification frontier. The process then continues back to block 90 and iterates until either conditional block 100 is negative or conditional block 130 is positive. In either case design verifier 110 proceeds to block 150 and outputs the verification result. A verification result may comprise a report indicating a successful or unsuccessful verification.

Figure 4:
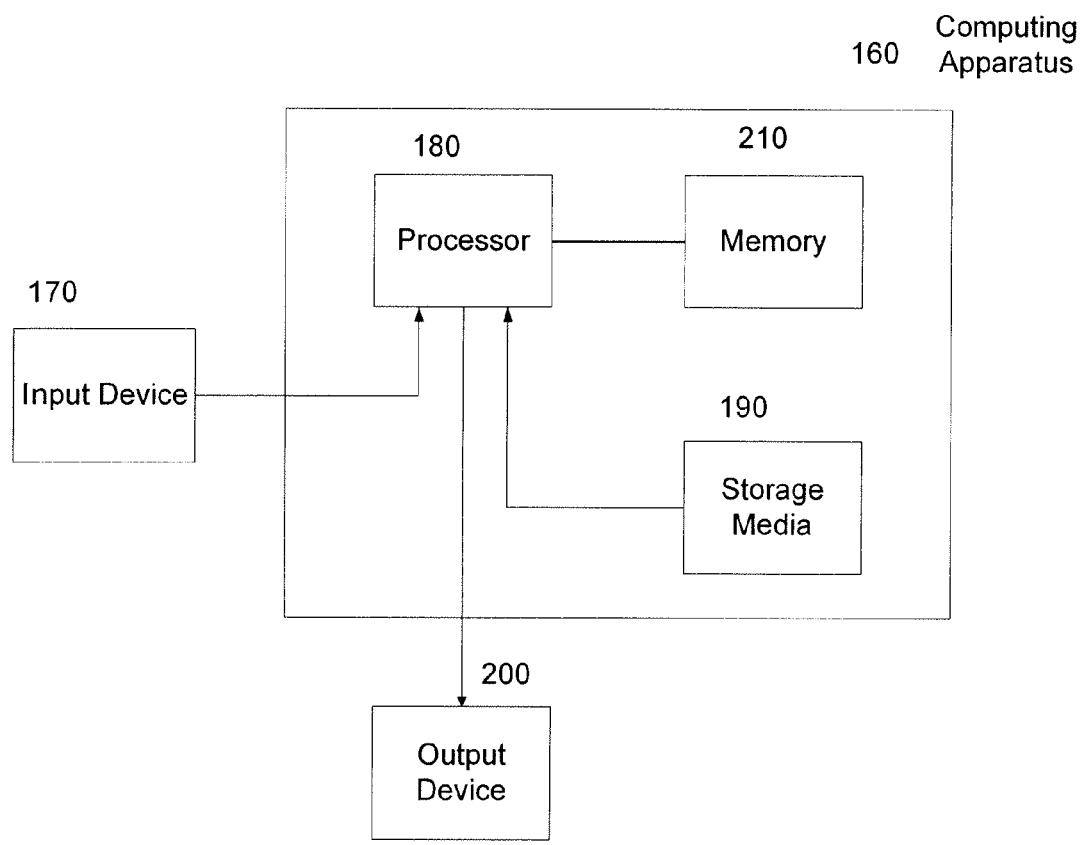
FIG. 4 illustrates an apparatus consistent with various embodiments provided.

Digital design verification can be significant in terms of calculation complexity, time to complete, and the memory requirements of a computer running the verification. In one embodiment, illustrated in FIG. 4, a computing apparatus 160 is provided. In this embodiment, computing apparatus 160 may be configured using a software product that implements the methods described above. Computing apparatus 160 may comprise an input device 170, a processor 180, a storage media 190, an output device 200 and memory 210. As is known in the art, various other components are necessary for computing apparatus 160 to be fully operational. These other components are not illustrated for purposes of convenience. Input device 170 may comprise a device for computer program product input, like a floppy drive, a CD-Rom drive, a DVD-drive, an optical drive to name a few. Many input devices 170 are known in the art and may be used to practice the present invention. In that regard, embodiments provided herein are not limited with respect to a particular input device 170. In like manner, various processors 180, storage media 190, output devices 200, and memory 210 are known in the art and may be used to practice the embodiments provided herein.

As stated above, computing apparatus 160 may be configured by a computer software product that may take the form of a media containing program instructions that configure computing apparatus 160 to perform a digital design verification. In one embodiment, the media may be external to computing apparatus 160 and intended to interface with computing apparatus 160 through input device 170. In another embodiment, the media containing the instructions may be a hard drive on a network where computing apparatus 160 is connected through a network connection (not shown). As is known in the art, a network may comprise a local area network within a company or may be a significantly larger network such as the Internet.

One feature of a computing apparatus 160 configured with the computer software product provided herein is that may efficiently verify digital designs of sizes where other software configurations may fail due to memory limitations.

Thus, it is seen that a method, computing apparatus and computer software product verification of digital designs are provided. One skilled in the art will appreciate that the present invention can be practiced by other than the above-described embodiments, which are presented in this description for purposes of illustration and not of limitation. The specification and drawings are not intended to limit the exclusionary scope of this patent document. It is noted that various equivalents for the particular embodiments discussed in this description may practice the invention as well. That is, while the present invention has been described in conjunction with specific embodiments, it is evident that many alternatives, modifications, permutations and variations will become apparent to those of ordinary skill in the art in light of the foregoing description. Accordingly, it is intended that the present invention embrace all such alternatives, modifications and variations as fall within the scope of the appended claims. The fact that a product, process or method exhibits differences from one or more of the above-described exemplary embodiments does not mean that the product or process is outside the scope (literal scope and/or other legally-recognized scope) of the following claims.

What is claimed is:

1. A computer-implemented method of verifying a property in a digital design description the method comprising:

(a) deriving an abstraction of the digital design description;
   (b) determining a counterexample by an approximate reachable state computation using a computer, the approximate reachable state computation relying on the abstraction, a property, and a search depth for the approximate reachable state computation;
   (c) justifying the counterexample with a minimum justification;
   (d) determining a justification frontier from a result of justifying the counterexample, wherein the justification frontier comprises a set of boundary variables and boundary variable assignments of the counterexample;
   (e) updating the abstraction from a subset of the justification frontier; and
   (f) producing a verification result for the digital design description, from the determining of the counterexample by the approximate reachable state computation or the determining of justification frontier.

2. The method of claim 1 further comprising repeating (b) through (e) until the justification frontier is empty before producing the verification result.

3. The method of claim 1 wherein the abstraction is initially empty.

4. The method of claim 1, wherein determining a counterexample further comprises partitioning the abstraction into a prefix function and a suffix function, wherein the prefix function comprises initial states of the abstraction and the suffix comprises remaining states.

5. The method of claim 4, further comprising determining an interpolant from the prefix and suffix functions.

6. The method of claim 5 further comprising updating a set of reachable states that comprises the initial states and the interpolant.

7. The method of claim 1, wherein the justification comprises assigning Boolean values to a subset of free variables of the abstraction.

8. The method of claim 1, wherein the justification comprises determining if the counterexample is an error in the abstraction.

9. The method of claim 1, wherein the updating the abstraction comprises adding variables and variable assignments to the abstraction from the justification.

10. An apparatus for verifying a property in a digital design description comprising:

a storage device coupled to a processor, the processor configured to verify a property in the digital design description by a configuration to
   (a) derive an abstraction of the digital design description;
   (b) determine a counterexample by an approximate reachable state computation, the approximate reachable state computation relying on the abstraction, a property, and search depth for the approximate reachable state computation;
   (c) justify the counterexample with minimum justification;
   (d) determine a justification frontier from a result of justifying the counterexample, wherein the justification frontier comprises a set of boundary variables and boundary variable assignments of the counterexample;
   (e) update the abstraction from a subset of the justification frontier; and
   (f) produce a verification result for the digital design description from the determining of the counterexample by the approximate reachable state computation or the determining of justification frontier.

11. The apparatus of claim 10, wherein the configuration further comprises a configuration to repeat (b) through (e) until the justification frontier is empty before producing the verification result.

12. The apparatus of claim 10 wherein the abstraction is initially empty.

13. The apparatus of claim 10, wherein the configuration to determine a counterexample further comprises a configuration to partition the abstraction into a prefix function and a suffix function, wherein the prefix function comprises initial states 10 of the abstraction and the suffix comprises remaining states.

14. The apparatus of claim 13, further comprising a configuration to determine an interpolant from the prefix and suffix functions.

15. The apparatus of claim 14, wherein the configuration further comprises a configuration to update a set of reachable states that comprise the initial states and the interpolant.

16. The apparatus of claim 10, wherein the justification comprises an assignment of boolean values to a subset of free variables of the abstraction.

17. The apparatus of claim 1, wherein the justification comprises a determination if the counterexample is an error in the abstraction.

18. The apparatus of claim 10, wherein the configuration to update the abstraction comprises adding variables and variable assignments to the abstraction from the justification frontier.

19. A computer software product for verifying a property in a digital design description, the product comprising a computer-readable storage device, in which program instructions are stored, and that, when read by a computer cause the computer to:
   (a) derive an abstraction of the digital design description;
   (b) determine a counterexample by an approximate reachable state computation, the approximate reachable state computation relying on the abstraction, a property, and a search depth for the approximate reachable state computation;
   (c) justify the counterexample with minimum justification;
   (d) determine a justification frontier from a result of justifying the counterexample, wherein the justification frontier comprises a set of boundary variables and boundary variable assignments of the counterexample;
   (e) update the abstraction from the justification frontier; and
   (f) produce a verification result for the digital design description from the determining of the counterexample by the approximate reachable state computation or the determining of justification frontier.

20. The computer software product of claim 19, wherein the instructions further comprise instructions to repeat (b) through (e) until the justification frontier is empty before producing the verification result.

21. The computer software product of claim 19, wherein the abstraction is initially empty.

22. The computer software product of claim 19, wherein the instructions to determine a counterexample further comprises an instruction to partition the abstraction into a prefix function and a suffix function, wherein the prefix function comprises initial states of the abstraction and the suffix comprises remaining states.

23. The computer software product of claim 22, further comprising a instruction to determine an interpolant from the prefix and suffix functions.

24. The computer software product of claim 23, wherein the instructions further comprise an instruction to update a set of reachable states, the set comprising the initial states and the interpolant.

25. The computer software product of claim 19, wherein the justification comprises an assignment of boolean values to a subset of free variables of the abstraction.

26. The computer software product of claim 19, wherein the justification comprises a determination if the counterexample is an error in the abstraction.

27. The computer software product of claim 19, wherein the instructions to update the abstraction comprise an instruction to add variables and variable assignments to the abstraction from the justification frontier.

\* \* \* \* \*